(12) United States Patent
Sendelweck

(10) Patent No.: US 6,590,430 B2
(45) Date of Patent: Jul. 8, 2003

(54) DUAL USE OF AN INTEGRATED CIRCUIT PIN AND THE SWITCHING OF SIGNALS AT SAID PIN

(75) Inventor: Gene Karl Sendelweck, Indianapolis, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/973,340

(22) Filed: Oct. 9, 2001

(65) Prior Publication Data

US 2003/0067329 A1 Apr. 10, 2003

(51) Int. Cl.[7] .............................................. H03K 17/00
(52) U.S. Cl. .......................................... 327/99; 327/407
(58) Field of Search ................................. 327/334, 365, 327/99, 407–411; 381/120

Primary Examiner—Kenneth B. Wells
(74) Attorney, Agent, or Firm—Joseph S. Tripoli; Joseph J. Laks; Reitseng Lin

(57) ABSTRACT

In a signal processing system with an IC having an intrinsic signal provided at a pin of the IC, a first operational function (de-emphasis) for the signal is provided at the pin, and further along in the signal flow path, a second operational function (variable attenuation) for the signal is provided within the IC. An extrinsic signal is switchably coupled to the pin so that the second operational function can be used to operate on the extrinsic signal. The second signal is coupled to the pin at a low source impedance so that when the second signal is switched to be operational, the first operational function is defeated, and the first signal is severely attenuated. When the circuit is switched to not couple the second signal to the pin, the coupling path for the second signal and the low source impedance are both removed, thus restoring the first operational function and the first signal at the pin of the IC.

13 Claims, 2 Drawing Sheets

DUAL USE OF AN INTEGRATED CIRCUIT PIN AND THE SWITCHING OF SIGNALS AT SAID PIN

FIELD OF THE INVENTION

The present invention relates to circuit arrangements for the multiplexing of signal functions at a single terminal of an integrated circuit (IC), and more particularly, to switchably coupling an extrinsic signal to the IC so that IC operational functions are available to control the extrinsic signal.

BACKGROUND

With much signal processing circuitry manufactured in integrated circuit form, it is desirable for the IC manufacturer to minimize the number of connections made to the integrated circuits. This is because connections to external circuits must be done through pins on the integrated circuit package, which are in part, a determinant of the size and cost of the integrated circuit.

In the instant case it is desirable in a low cost electronic device, e.g., a television receiver or radio receiver, to provide front panel audio/visual input jacks in a device having an internal volume control in an IC manufactured for processing an audio signal with no provision made for an external audio input. To incorporate such a desirable feature with such an IC would ordinarily require using a separate audio IC in order to provide a volume control for such an auxiliary audio signal. Such an approach would incur a considerable extra cost. Thus, to make maximum use of such an IC, it is desirable to combine or multiplex additional functions on or at a terminal/pin of an IC which had been previously dedicated by the IC manufacturer for other purposes. As used herein, the terms pin and terminal for an IC are synonymous.

The multiple use of an integrated circuit pin is shown in U.S. Pat. No. 4,434,474 of Best et al., U.S. Pat. No. 4,293,870 of Steckler et al., of an antecessor of the assignee of the present patent application, and U.S. Pat. No. 4,173,769 of van Straaten. U.S. Pat. No. 5,594,442 of Paulos et al. shows a digital IC wherein connection of an external digital signal is made to an IC pin used for switching a digital de-emphasis circuit. U.S. Pat. No. 4,675,550 of Hafner shows using a single input terminal for two signals having differing voltage levels.

SUMMARY OF THE INVENTION

In a signal processing system with an IC having an intrinsic signal provided at a pin of the IC, a first operational function, for the signal is provided at the pin, and further along in the signal flow path, a second operational function, for the signal is provided within the IC. An extrinsic signal is switchably coupled to the pin so that the second operational function can be used to operate on the extrinsic signal. The second signal is coupled to the pin at a low source impedance so that when the second signal is switched to be operational, the first operational function is defeated, and the first signal is severely attenuated. When the circuit is switched to not couple the second signal to the pin, the signal path for the extrinsic signal and the low source impedance are both removed, thus restoring the first operational function and the first signal at the pin of the IC.

BRIEF DESCRIPTION OF THE DRAWINGS

Reference can be made to the drawings wherein.

DETAILED DESCRIPTION OF THE PREFERRED EMBODIMENTS

Figure 1:
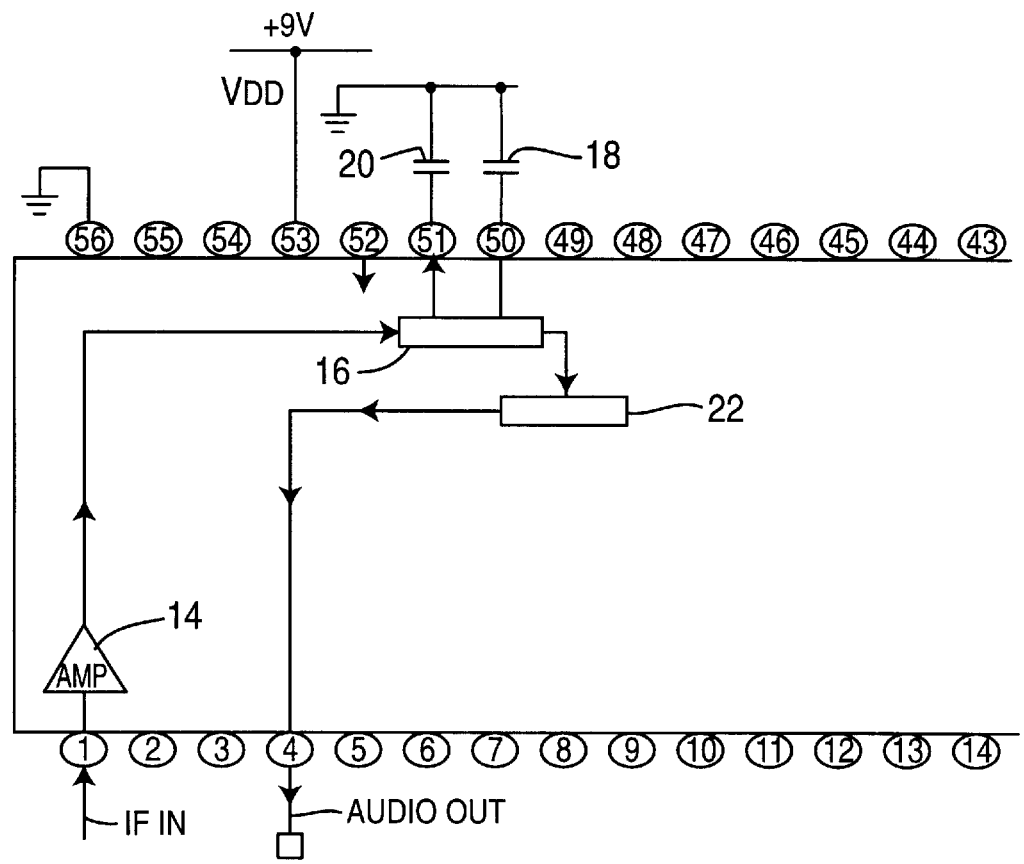
FIG. 1 shows a diagrammatic representation of pertinent pins of the integrated circuit along with block diagrams of electronic functions associated with said pins.

The present integrated circuit is a TB1253AN microprocessor made by the Toshiba Company of Japan. FIG. 1 shows a diagrammatic representation of pertinent pins of the IC. A 4.5 MHz sound carrier IF signal is coupled to pin 1 where it is amplified at 14, and amplified and demodulated by FM detector/demodulator 16. Pin 50 is a DC filter pin with capacitor 18 coupled to ground and pin 51 is the de-emphasis pin with a 2200 pF capacitor 20 coupled to ground which, in combination with an internal 34 Kohm resistor 34 (see FIG. 2), provides the 75 usec de-emphasis characteristic required to equalize the pre-emphasis provided at the FM transmitter to the FM signal for improving signal to noise ratio. An attenuator 22 follows detector/demodulator 16 in the audio path and will only work with the intrinsic demodulated audio signal derived from detector 16, and will not work with a signal from an external source because no provision had been made for the chip to accept such an extrinsic signal. The output from attenuator 22 is coupled to pin 4 for providing a wideband FM stereo output signal. However, according to aspects of the present invention, dual use of pin 51 which includes the de-emphasis filter, is now possible as explained hereinafter, so that the chip can accommodate the injection of an extrinsic signal which will be controllable by attenuator 22.

Figure 2:
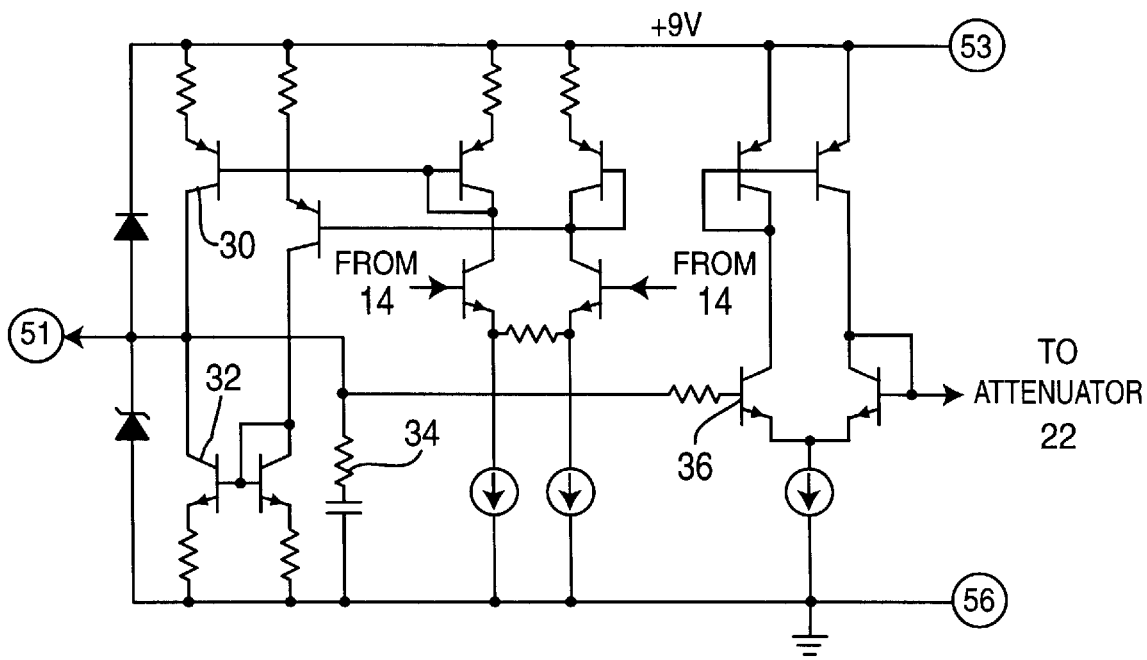
FIG. 2 shows a schematic of a pertinent part of the integrated circuit of FIG. 1.

FIG. 2 shows a schematic of a part of the internal circuitry of the detector/demodulator 16 of the IC shown in FIG. 1 concerning pins 51, 53 and pin 56, with pin 56 being at a reference potential with respect to pins 51 and 53. The demodulated audio is coupled by means of transistors 30, 32 to pin 51 where de-emphasis capacitor 20 works with resistor 34 to provide the 75 usec de-emphasis filter network. The signal from pin 51 is then coupled to transistor 36 and on to audio attenuator 22. The remainder of the chip internal circuitry shown in FIG. 2 forms no part of the present invention, and is only shown in the interest of completeness. Accordingly, except for the particular components discussed above, no further discussion of the chip internal circuitry shown in FIG. 2 will be made except as may be necessary to disclose and/or claim the present invention.

Figure 3:
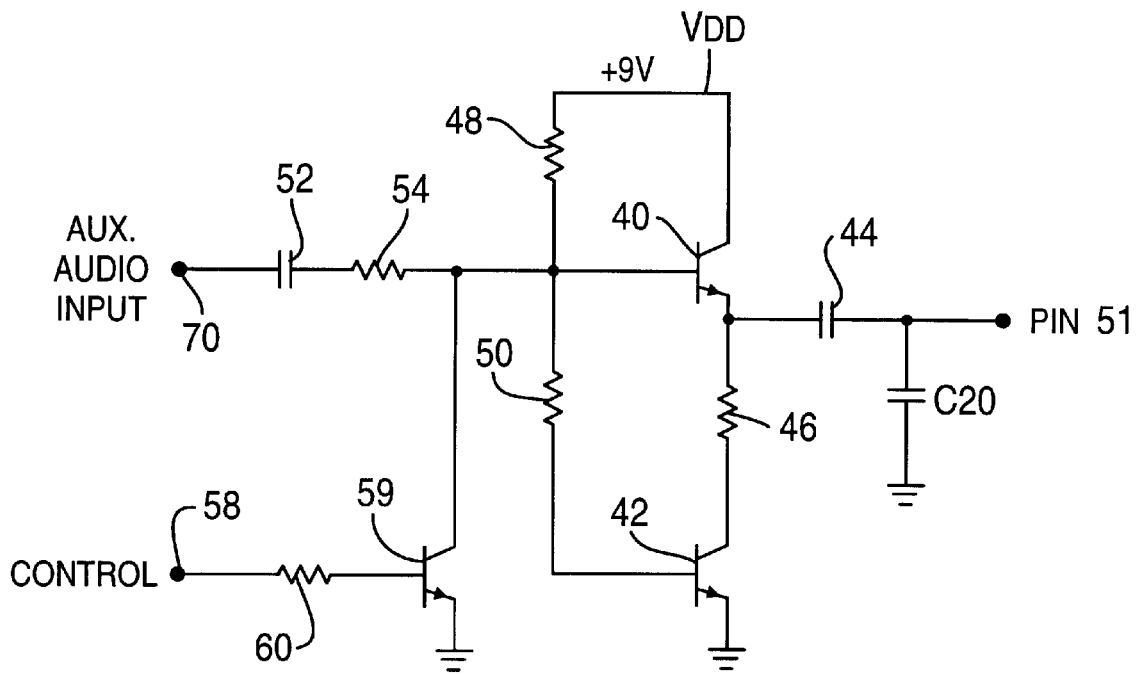
FIG. 3 shows a schematic of one embodiment of a signal coupling circuit according to aspects of the present invention.
Figure 4:
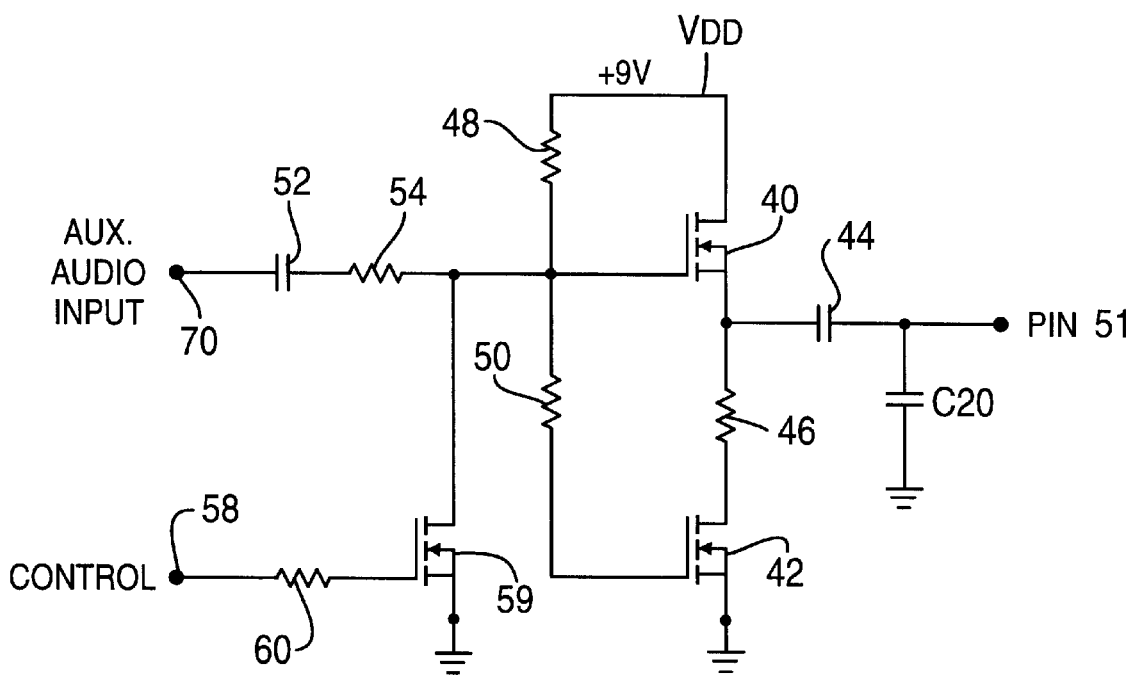
FIG. 4 shows a schematic of another embodiment of a signal coupling circuit according to aspects of the present invention.

The de-emphasis filter capacitor at pin 51 is in the audio signal path and according to aspects of the present invention, pin 51 is an injection point for the external audio signal. With proper switching, this approach provides an inexpensive way to get volume attenuation for an extrinsic audio signal derived from, e.g., front panel audio jacks on a television receiver. Thus, with the extrinsic signal at pin 51 injected by a low impedance source, i.e., lower than the impedance of capacitor 20, such a signal would be coupled to transistor 36 and on to attenuator 22 where the signal can be acted upon. A circuit to do this is shown in FIG. 3. FIG. 4 shows a circuit using N channel MOSFET transistors wherein the corresponding components are labeled with the same numerals as in FIG. 3. The discussion of FIG. 3 also applies to FIG. 4 and, in the interest of brevity, will not be separately repeated for FIG. 4.

Referring now to FIGS. 3 and 4, in a signal coupling mode, transistors 40 and 42 are of a like conduction type, e.g., NPN/N channel OSFET, and are connected in series between the power supply VDD and ground, with the extrinsic signal to be derived from the emitter/source electrode of transistor 40 through coupling capacitor 44 to de-emphasis filter capacitor 20 and pin 51. A resistance 46 couples the emitter electrode of transistor 40 to the collector electrode of transistor 42. Bias divider resistors 48, 50, coupled from the power supply VDD, place transistor 42 in a saturation state, with the junction between resistors 48, 50 biasing transistor 40 to be in a linear portion of its operational characteristic.

The signal from an auxiliary audio input (extrinsic signal) at terminal 70 is coupled to the base electrode of transistor 40 through coupling capacitor 52 and isolation resistor 54. Transistor 40, with a signal grounded collector, is in an emitter/source follower configuration so that the output impedance of the amplifier is the low resistance of resistor 46, herein 680 ohms, in parallel with a low output impedance of the emitter/source electrode of transistor 40. The effect of this arrangement is two fold. Firstly, the low output impedance negates any adverse shunting effect of capacitor 20 on the extrinsic signal. Secondly, with this low output impedance coupled from pin 51 to ground, the intrinsic signal is attenuated to virtually zero so that there is no simultaneous presence of the intrinsic and extrinsic signals at pin 51, i.e., when the extrinsic signal is switched "on", the intrinsic signal is switched off In order to switchably control the circuit of FIGS. 3 and 4, the collector electrode of transistor 59 is coupled to the base electrode of transistor 40, and the base electrode of transistor 59 is coupled without bias to control terminal 58 through isolation resistor 60. In the above discussed signal coupling mode, transistor 59, without bias, is an open circuit and does not affect the signal coupling circuit. However, when a positive control signal is applied to terminal 58 in order to switch the extrinsic signal "off", transistor 59 is saturated and pulls the base electrode of transistor 40 nearly to ground. Transistor 40 becomes reverse biased (cutoff) and transistor 42, previously in saturation, also becomes cutoff. The effect of this signal non-coupling arrangement is three fold. Firstly, with transistor 40, being cutoff, there will no longer be a coupling of the extrinsic signal to pin 51. Secondly, with transistor 40 being cutoff, the low source impedance presented by its emitter electrode is changed to be an open circuit. Thirdly, the other part of the low source impedance, resistor 46, is open circuited since transistor 42, previously in saturation, loses its bias and is also switched to be in a cutoff status. Thus, in this non-signal coupling mode, the attenuation of the intrinsic signal is removed, the two impedances loading capacitor 20 and pin 51 are removed, the coupling of the extrinsic signal to pin 51 is removed, and the intrinsic signal and the de-emphasis filter network operate normally.

The control signal at terminal 58 can be generated, e.g., by a microprocessor (not shown) in response to a front panel or remote control signal, or responsive to the insertion/removal of a front panel plug from a front panel switching input jack.

As used herein, an action, e.g., switching at the pin of the IC, includes an electronic/electrical action performed physically distant from the pin with the action being coupled to the pin.

As used herein, conductivity type means, e.g., NPN or PNP junction bipolar transistors regardless of the process used for manufacturing the transistors, e.g., alloy, epitaxial, and JFET, CMOS, MOSFET devices of N or P channel, etc.

As used herein, for JFET, CMOS and MOSFET devices etc., a gate or control electrode is considered to be the equivalent of a base electrode of a junction transistor, and a drain electrode and a source electrode are considered to be the respective equivalents of a collector electrode and an emitter electrode of a junction transistor. It should be noted that recent versions of field effect transistors, regardless of whether they are discrete or part of an IC, are symmetrical with the drain electrodes and source electrodes being interchangeable.

As used herein an intrinsic signal is a signal which has had a signal flow within the IC prior to the signal's arrival at pin 51 of the IC, and an extrinsic signal is a signal which originates external of the IC.

What is claimed is:

1. A circuit for coupling an input signal to a signal processing circuit, comprising:

an input terminal for receiving the input signal, a first transistor having a first terminal coupled to the input terminal, a second terminal coupled to a power source, a third terminal coupled to the signal processing circuit for coupling the input signal to the signal processing circuit, and a bias means coupled to the first transistor for biasing the first transistor between a linear state and a cutoff state, wherein wherein when the first transistor is biased to be in the linear state, the coupling circuit is in a signal coupling mode and the third terminal is switched to a first impedance with respect to a reference point for coupling the input signal to the signal processing circuit, and when the first transistor is biased to be in the cutoff state, the coupling circuit is in a non-signal coupling mode where the input signal is decoupled from the signal processing circuit and the third terminal is switched to a second impedance higher than the first impedance.

2. The circuit of claim 1 further comprising a second transistor having first, second, and third terminals, wherein the first terminal of the second transistor is coupled to the power source, the second terminal of the second transistor is coupled to the third terminal of the first transistor, the third terminal of the second transistor is coupled to the reference point, the biasing means is also coupled to the second transistor for biasing the second transistor between a cutoff state and a saturated state, and when the bias means biases the second transistor to be in a saturated state, the coupling circuit is in the signal coupling mode.

3. The circuit of claim 1 wherein a second transistor is placed into a saturation state by the bias means to provide the first impedance.

4. The circuit of claim 1 wherein switching between a signal coupling mode to a non-signal coupling mode is responsive to a control signal from a microprocessor.

5. The circuit of claims 2 or 3 wherein the first and second transistors are of the same conductivity type and are connected in series with each other between a power supply source and a reference point.

6. The circuit of claim 1 wherein the signal processing circuit is included in an integrated circuit having a pin and the coupling circuit is coupled to the pin, the signal processing circuit has an electrical component connected from the pin to the reference point, the first impedance is a sufficiently low impedance to negate the circuit function of the electrical component by loading the electrical component, and the second impedance is a sufficiently high impedance to unload the electrical component and restore functionality to the electrical component.

7. The circuit of claim 6 wherein the pin carries a signal intrinsic to the integrated circuit and when the coupling circuit is in a signal coupling mode, the first impedance greatly attenuates the signal intrinsic to the integrated circuit.

8. The circuit of claim wherein the pin serves as a bi-directional conduit of signals.

9. The circuit of claim 7 wherein when the circuit is in a non-signal coupling mode, the second impedance is sufficiently high so as to effectively not attenuate the signal intrinsic to the integrated circuit.

10. The circuit of claim 1 wherein the boas means includes a third transistor having first, second, and third terminals, which are coupled to a control signal, the first terminal of the first transistor, and the reference point, respectively, such that when the control signal indicated the non-coupling mode, the second terminal of the third transistor is electrically coupled to the third terminal causing the first transistor to be in the cutoff state.

11. A circuit for switchably coupling an input signal to a signal processing circuit, comprising:

means for coupling the input signal to the signal processing circuit, and means for placing the coupling means in a selected one of a signal coupling mode and a non-signal coupling mode, wherein the coupling means couples the input signal to the signal processing circuit at a source impedance by coupling the input signal via a resistor that is coupled to a reference point when the placing means places the coupling means is in the signal coupling mode, and the coupling means decouples the input signal from the signal processing circuit and the resistor is decoupled from the reference point when the coupling circuit is in a non-signal coupling mode.

12. The circuit of claim 11 wherein the coupling means includes a first transistor in an emitter/source follower configuration and in the non-signal coupling mode the first transistor is biased to be in a cutoff state.

13. The circuit of claim 1, wherein the resistor is decoupled from the reference point by a second transistor coupled between the resistor and the reference point with the second transistor being biased to be cutoff state.

* * * * *